United States Patent [19]

Yamazaki et al.

[11] Patent Number: 4,786,358

[45] Date of Patent: Nov. 22, 1988

[54] METHOD FOR FORMING A PATTERN OF A FILM ON A SUBSTRATE WITH A LASER BEAM

[75] Inventors: Shunpei Yamazaki, Tokyo; Akira Mase, Atsugi; Hiroyuki Sakayori, Machida, all of Japan

[73] Assignee: Semiconductor Energy Laboratory Co., Ltd., Atsugi, Japan

[21] Appl. No.: 82,545

[22] Filed: Aug. 7, 1987

[30] Foreign Application Priority Data

Aug. 8, 1986 [JP] Japan .............................. 61-186200
Aug. 8, 1986 [JP] Japan .............................. 61-186199
Aug. 8, 1986 [JP] Japan .............................. 61-186202

[51] Int. Cl.⁴ ...................... B44C 1/22; C03C 15/00; C03C 25/06; C23F 1/02
[52] U.S. Cl. .................................. 156/643; 156/638; 156/656; 156/667; 156/902; 219/121.69; 219/121.85; 427/53.1
[58] Field of Search ............... 156/638, 643, 655, 656, 156/667, 902; 427/53.1; 219/121 LJ, 121 LR, 121 LW, 121 LM

[56] References Cited

U.S. PATENT DOCUMENTS

| 3,866,398 | 2/1975 | Vernon et al. ..................... 156/643 |
| 3,867,217 | 2/1975 | Maggs et al. ...................... 156/643 |
| 4,181,563 | 1/1980 | Miyaka et al. ............. 219/121 LM |
| 4,358,659 | 11/1982 | Spohnheimer ................ 219/121 LJ |
| 4,508,749 | 4/1985 | Brannon et al. ............ 219/121 LM |

Primary Examiner—William A. Powell
Attorney, Agent, or Firm—Gerald J. Ferguson, Jr.

[57] ABSTRACT

An improved method for forming a pattern on a substrate coated with a film is shown. The substrate is irradiated with a laser beam which is shaped through a mask, and a portion of the film is removed by the energy of the laser beam to produce the desired pattern. The laser beam is emitted from an exmer laser.

15 Claims, 5 Drawing Sheets

FIG.2(CAm) 

METHOD FOR FORMING A PATTERN OF A FILM ON A SUBSTRATE WITH A LASER BEAM

BACKGROUND OF THE INVENTION

The present invention relates to a method for forming a film pattern on a substrate.

As a method for producing a desired pattern on a substrate using light without a photoresist, laser processing is well known by means of a YAG laser (the wavelength is 1.06 microns). In this process, a substrate with a film to be patterned is irradiated with a spot laser beam which is moved along a line on the substrate to produce a groove as congregation of spots by removing a portion of the film by the energy of the laser beam. Because of this, the scanning speed and the energy density of the laser beam must be chosen finely in correspondence to the thermal conductivity and the sublimability of the film to be processed. So it is difficult to manufacture products within the specification determined for this product without lowering the yield. Further, the laser beam from a YAG laser conveys only the photon energy of 1.23 eV and the pulse width is no shorter than 80 namo seconds in order to give a sufficient energy to the film. The beam energy tend to disperse on the film, e.g., a metallic film or transparent conductive film both having a large thermal conductivity while an underlying insulating substrate, e.g., a glass substrate, has a conductivity smaller than that of the film by more than one order of magnitude. Namely, the energy applied to the part to be removed in dissipated to heat the neighboring part of the film.

In the laser machining with a YAG laser by means of Q-switching, a film on a substrate must be scanned at a scanning speed of 30-60 cm/min with strong laser beam with an average power of 0.5-1 W in the case that the spot diameter is 50 micron meters, the pulse frequency is 3 KHz, and the pulse width is 100 namo seconds. As a result, the underlying surface is likely damaged by the high energy and causes micro-cracks thereon in the form of scales similar to the configuration of section view of laser beam.

Further, because of laser beam with a long wavelength, the machined portion tend to bulge its edge. Particularly, in the case of process of a metallic thin film, liquid metal appears on the edge due to the transmission of thermal energy in a lateral direction, and forms a swell portion due to the surface tension of the liquid metal. For this reason, a sharp edge can not obtained. In addition, when Q-switcing is used, the maximum value of the laser energy is apt to fluctuate during long use so that the condition must be checked before every use.

Still further, it is entirely impossible to produce selectively fine patterns with a very narrow interval of 10 to 50 microns on a same substrate. And frequently the patterning may be only in insufficient manner so that additional etching must be carried out with an etchant solution.

A related patent application has been filed with Japanese Patent Office. The application number is sho 59-211769.

SUMMARY OF THE INVENTION

It is therefore an object of the invention to provide a method for laser patterning process which can be carried out with a very short process time.

It is another object of the invention to provide a method for laser processing which can be used to pattern a surface of a substrate.

It is a further object of the invention to provide a method for producing a desired pattern on a substrate in a very simple manner.

BRIEF DESCRIPTION OF THE DRAWINGS

FIGS. 2(A) to 2(F) are explanatory views showing the process in accordance with the invention.

DETAILED DESCRIPTION OF THE PREFERRED EMBODIMENT

Figure 1:
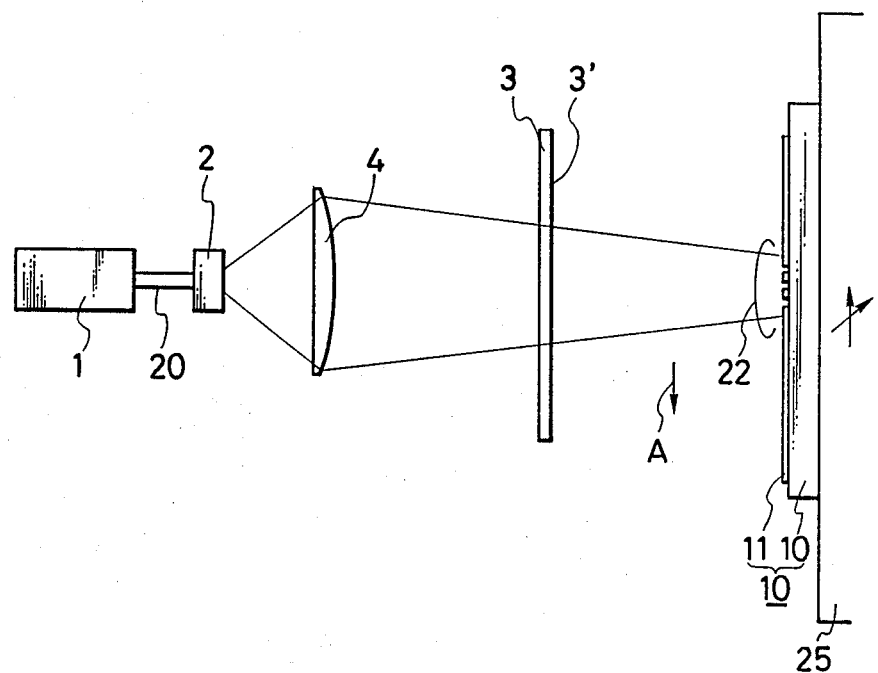
FIG. 1 is a block diagram showing a system for laser scribing method in accordance with the present invention.

Referring to FIG. 1, patterning of electrode arragement in accordance with the present invention is explained. A substrate, e.g., a glass substrate 10 provided thereon, with a transparent conductive film 11, e.g., made of $SnO_2$ (Eg.=3.5 eV) to be processed is mounted on a base 25. Opposing to the substrate 10, an optical system is arranged approximately on a line normal to the surface of the substrate to be processed. The substrate is irradiated with a laser beam with 248 nm in wavelength and with 5.0 eV in photon energy, which is emitted from an eximer laser 1 using KrF (distributed from Questec Inc.), expanded by an expander 2 in one direction, contracted through a convex cylindrical lense 4 made of artificial quartz, and shaped through a mask 3. The laser beam has a rectangular cross section generally when emitted from an eximer laser. Assuming the efficiency by 3%, the energy of laser beam from the laser 1 is 350 mJ/sec. The mask is made of a quarts pane whose rear surface is partially provided with shading material to form a desired pattern through which the laser beam can be shaped. The shading material is preferably a heat resistant material such as cromium, $MoSi_2$ or the like. The laser beam is first generated with a section area of 16 mm×20 mm, next expanded to 16 mm×300 mm on the convex lense 4. The power density of the laser beam on the convex lense 4 is $5.6 \times 10^2$ mJ/mm². Because the optical energy gap is 5.0 eV, the transparent film can sufficiently absorb the photon energy and be selectively removed.

The laser beam passing through the convex lense 4 is contracting at such a proportion that, if it were not for the mask 3, the shorter side length of the rectangular cross section would be 100 microns on the substrate 1. With the mask 3, the laser beam is shaped to have a rectangular cross section 30 cm long 20 micron wide. The laser beam is radiated intermittently with the pulse width of 20 namo seconds at 1 to 100 Hz, e.g., 10 Hz. Once irradiated with the pulsed beam, the transparent film is made chalky white and formed into fine powder. This irradiation is carried out at an negative pressure lower than $10^{-3}$ Torr. The irradiated portion of the film is removed by ultrasonic cleaning (the frequency is 29 KHz) for 1 to 10 minutes in water solution of aceton.

According to experimental, no damage was observed on the underlying substrate.

The scanning of the surface of the substrate is done by moving the base 25 or by shifting the laser beam along an arrow A. The base can be conprised of a X table and a Y table which are movable in the X and Y directions respectively.

Figure 2A:
Figure 2B:
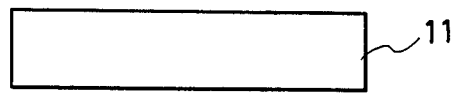
Figure 2D:
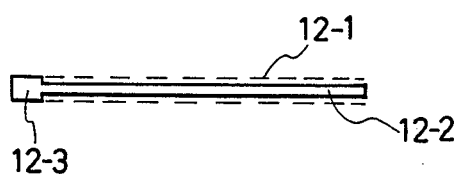
Figure 2E:
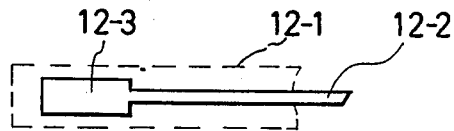
Figure 2F:
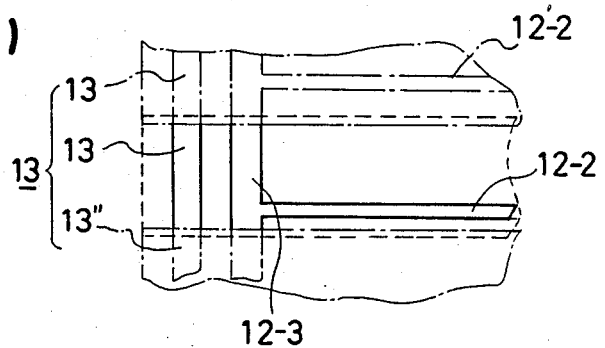
Figure 3A:
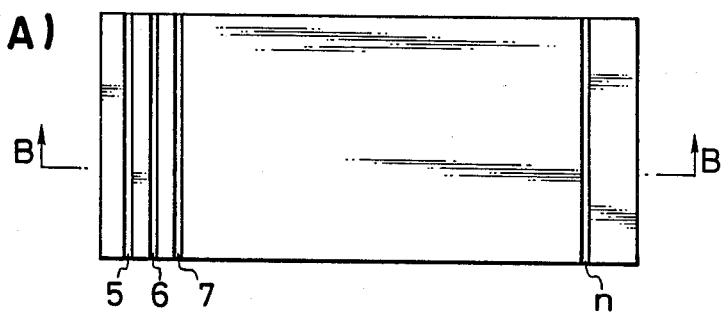
FIGS. 3(A) and (B) are plan and side views showing the process in accordance with the present invention.
Figure 3B:

Referring to FIGS. 2(A) to 2(F), the shaping of the laser beam is explained as a first embodiment of the invention. Laser beam emitted from the eximer laser 10 having a rectangular cross section as shown in FIG. 2(A) is expanded in a lateral direction as shown in FIG. 2(B). The periphery 12-1 of the expanded laser beam is removed with the mask 3 to obtain a desired cross section 12-2 according to which the conductive film is patterned, as shown in FIG. 2(C). The width of the laser beam 12-1 on the mask 13 prior to the removal is 100 microns. The width of the laser beam 12-2 after removed by the mask 13 is 20 microns. The periphery of the laser beam can leave without being removed at one end (or both ends) as shown in FIG. 2(D). In this case, there exists no mask at the position corresponding to the end. Similar configuration of laser beam can be obtained also by removing the complete perimeter of the expanded laser beam as shown in FIG. 2(E). As shown in FIG. 2(F), out of the laser beam can be removed a line 12-2 elongated along the expanded laser beam and lines 12-3 perpendicular to the line 12-2 located on the distal end of the laser beam, one 12-3 being connected to the linear portion 12-2 and the other 13 being separated therefrom. Two vertical lines (grooves) 13 and 12-3 can be formed together with a plurality of discrete lateral lines (grooves) 12-2 and 12'-2 by repeating the process using such a patterned laser beam in a manner that a portion of the film is irradiate twice by the lower periphery of the laser beam and the upper periphery of a subsequent laser beam. FIGS. 2(E) and 2(F) are drawn as an expanded view in comparison with FIGS. 2 (C) and 2(D). FIG. 3 shows a process for machining a plurality of grooves 5, 6,. 7 . . . , n. Once pulsed laser beam is radiated to the substrate, the Y table is moved by 15 mm and the substrate is irradiated again with pulsed laser beam. In accordance with this process, 640 grooves with 20 microns in narrower width 45 and with 100 microns in wider width 45' were formed on a substrate with 320 microns in distance, using pulsed laser of 30 Hz. The process time was 0.6 minutes.

According to this method, experimental was made for an ITO (indium oxide containing tin oxide at 5 weight %) film formed by electron beam deposition on a non-single crystalline semiconductor substrate to which hydrogen or fluoride is added. The substrate was placed at a vacuum condition of lower than $10^{-5}$ Torr and processed by the laser processing in accordance with the invention using a KrF eximer laser with 248 nm in wavelength. The pulse width was 10 namo seconds. The average output power was 2.3 mJ/mm$^2$, then a portion of the film was sublimed to divide the film.

Referring now to FIGS. 4(A) to 4(E), a second embodiment of the invention is explained. This process is carried out using the system illustrated in FIG. 1 and largely similar to the foregoing process for the first embodiment and thereby redundant explanation will not repeated.

Figure 4A:
FIGS. 4(A) to 4(E) are explanatory views showing the process in accordance with the present invention.
Figure 4B:
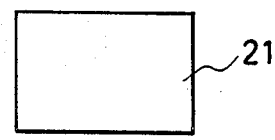
Figure 4C:
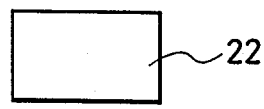
Figure 4D:
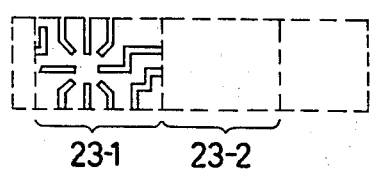
Figure 4E:
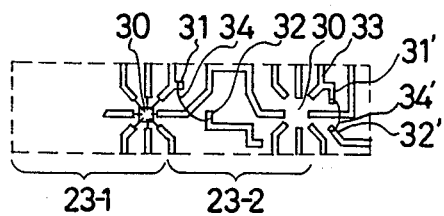

Laser beam emitted from the eximer laser 1 first has a cross section of 15 mm×20 mm (FIG. 4(A)) and expanded in a cross section (FIG. 4(B)) and shaped through the mask 3 so that laser beam is radiated to the substrate with 5 mm×5 mm in cross section (FIG. 4(C)). In this case, by virtue of the pattern 23-1 provided on the mask 3, the thin film, e.g., a conductive film, on the substrate is selectively removed in accordance. The illustration in FIG. 4(D) shows lead arrangement on a IC substrate for connection with a chip to be mounted thereon. The patterning can be repeatedly carried out by moving the substrate sequentially in the left direction. FIG. 4(E) is explanatory view showing a relatively large pattern. For such a large pattern, the mask 3 and the substrate are kept in certain positions and scanned with laser beam 23-1, 23-2, . . . so that the substrate is irradiated with laser beam in sequence corresponding to various patterns prescribed on the mask. In this figure, 30 designates the position where an IC chip should be mounted. 31 and 32 or 31' and 32' designate pads for cross-lead arragement. After laser scribing, the pads are connected with wires 34 and 34' and then the wires are air-isolated to avoid cause a short circuit. The wire bonding for the pads 31 and 32 or 31' and 32' and for connection with an IC chip can be carried out simultaneously. With this process, patterning on a substrate having an area of 2 cm×30 cm was completed only in about 5 minutes. The number of steps required for patterning process is reduced from 7 steps to 2 steps (light irradiation and cleaning) in comparison with a conventional mask alignment process using photo resist. The total processing time is only about 5 to 10 minutes.

Figure 5A:
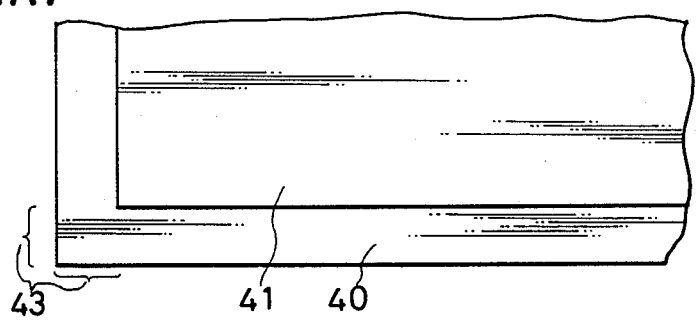
FIGS. 5(A) to 5(D) are explanatory views showing the process in accordance with the present invention.
Figure 5B:
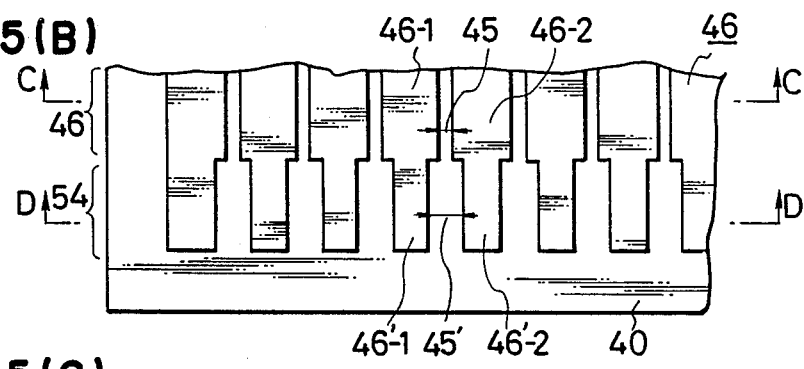
Figure 5C:
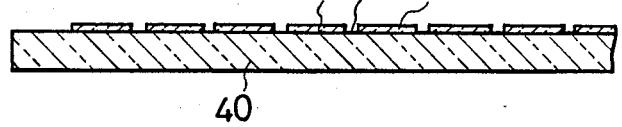
Figure 5D:
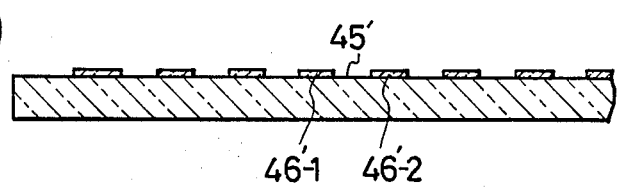

Referring to FIGS. 5(A) to 5(D) and FIGS. 6(A) and 6(B), the manufacturing process for liquid crystal device in accordance with the present invention. In FIG. 5(A), a transparent conductive film 41, e.g., an indium tin oxide film, is formed on a rectangular transparent substrate 40 (e.g., a glass substrate) by spattering using a metallic mask to produce a margin on the peripheral portion 43 of the substrate 40 free of the conductive film 41. The conductive film is patterned by the method explained above. Namely, a plurality of grooves 45 are formed together with relatively wide grooves 45' provided at the end of the groove 45 respectively. FIG. 5(B) is a partial plan view and FIGS. 5(C) and 5(D) are cross section views taken along lines C—C and D—D of FIG. 5(B). With this process, a plurality of electrode strips 46-1, 46-2, . . . are formed which are provided with narrow pads 46'-1 and 46'-2 for making contact with an external circuit.

Figure 6A:
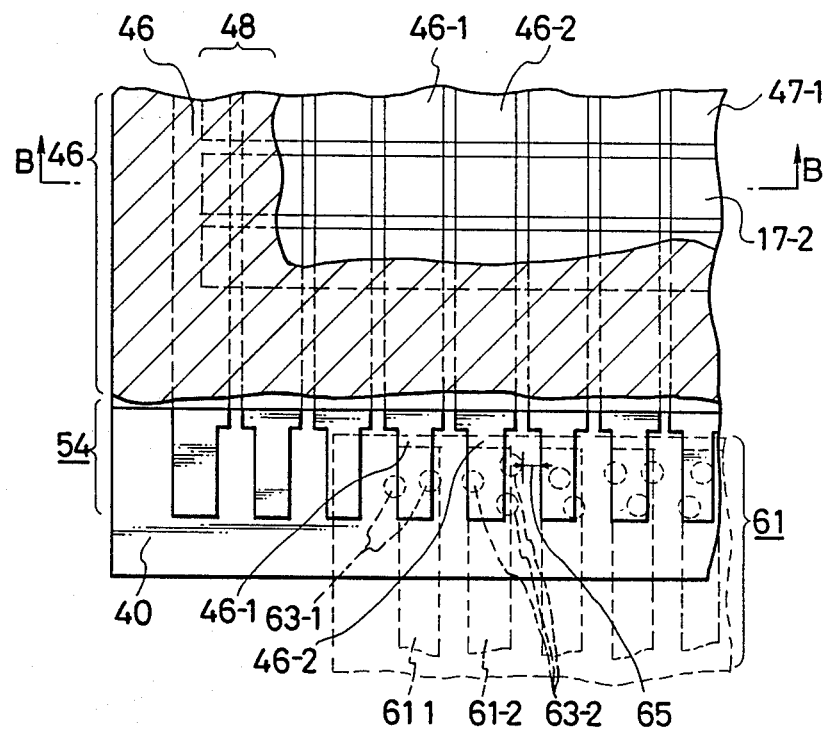
FIGS. 6(A) to 6(B) are explanatory views showing the process in accordance with the present invention.
Figure 6B:
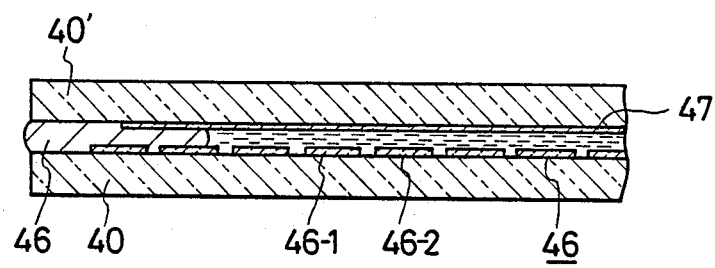

The substrate 40 is mated with another substrate 40' whose inside are provided with a plurality of electrode strips 47-1 and 47-2, . . . which are arranged perpendicular to the strips 16-1 and 16-2, . . . . as shown in FIGS. 6(A) and 6(B). The perimeter of the substrates is sealed with organic resin 6 and an amount of liquid crystal is disposed between the substrates 40 and 40'. The exposed inside of the substrate 40 provides the pads 46-1 and 46-2 for connection. On this portion, a flexible lead board 61 is mounted together with leads 61-1, 61-2, . . . provided on the its side, with solder balls 63-1 inbetween. The pads of the substrate 40 and the leads of the board 61 in coincidence are electrically connected by heating and melting the solder balls. The distance between adjacent pads is determined, e.g., at 40 to 100 microns so that no connection must not cause inbetween. According to an estimate, liquid crystal displays with panels of A4 size can be manufactured at about 1000 Japanese Yen in case of production of 5000 goods per month.

While the present invention is described in conjunction with preferred embodiments, the invention should not be limitted to the particular example but only limited to the appended claims. Many modifications and variations may cause to those skilled in the art. For example, using a similar process explained in the first embodiment, the remaining portion of film can be formed with 20 microns in width while the film is removed with the width of 400 microns. In this case, it is advantageous for production yield to chose the width of the slit of mask at 50 to 100 microns through which laser beam is shaped. Between the beam expander and the substrate, an integrater, a condenser lense and a projection lense can be arranged in parallel in order to make the system highly accurate. Although the mask is disposed between the substrate 11 to be coated and the cylindrical lense 4, the mask can be a metallic mask disposed between the laser 1 and the cylindrical lense 4. The metallic mask can be formed by removing a portion of a metallic plate to produced a desired pattern.

What is claimed is:

1. A method for forming a pattern of a film provided on a substrate, said method comprising the steps of:
   generating a laser beam from an eximer laser;
   expanding said laser beam by an expander;
   contracting said expanded laser beam through a convex lense;
   shaping said contracted laser beam through a mask; and
   irradiating said film with said shaped laser beam to remove selected portion of said film.

2. A method of claim 1 further comprising a step of cleaning the pattern thus formed.

3. A method of claim 2 wherein said cleaning step is ultrasonic cleaning.

4. A method of claim 3 wherein said ultrasonic cleaning is carried out with an alcohol or aceton.

5. The method of claim 1 wherein said mask is formed with a slit through which said contracted laser beam is shaped to have a linear cross section.

6. The method of claim 5 wherein said irradiating step is carried out repeatedly while the irradiating portion of substrate is shifted with reference to the laser beam in the direction perpendicular to the slit.

7. The method of claim 6 wherein said slit has a wide end.

8. The method of claim 1 wherein the pattern of said mask is formed to remove the portion of said contracted laser beam except for an elongated narrow portion and a wide end portion connected with the distal end of said narrow portion.

9. The method of claim 8 wherein said irradiating step is carried out repeatedly while the irradiating portion of substrate is shifted in the direction perpendicular to the elengated direction of said narrow portion by an shifting amount which is less than that corresponding to the width of said wide end but larger than that corresponding to the width of said narrow portion.

10. The method of claim 1 wherein said mask is patterned in accordance with a lead pattern for connection with an IC chip which is to be mounted on said substrate.

11. The method of claim 1 wherein said mask comprises a transparent board and a shading pattern formed thereon.

12. The method of claim 11 wherein said board is made of artificial quartz.

13. The method of claim 1 wherein said substrate is mounted on a base.

14. The method of claim 13 wherein said base comprises a X table and a Y table.

15. A method for forming a pattern of a film provided on a substrate, said method comprising the steps of:
   generating a laser beam from an eximer laser;
   expanding said laser beam by an expander;
   shaping said contracted laser beam through a mask;
   contracting said expanded laser beam through a convex lense;
   shaping said contracted laser beam through a mask; and
   irradiating said film with said shaped laser beam to remove selected portion of said film.

* * * * *